US008532112B2

(12) United States Patent
Prihed et al.

(10) Patent No.: US 8,532,112 B2
(45) Date of Patent: Sep. 10, 2013

(54) INTERLEAVING FOR WIDEBAND CODE DIVISION MULTIPLE ACCESS

(75) Inventors: Assaf Prihed, Ness Zionna (IL); Shai Kalfon, Hod HaSharon (IL)

(73) Assignee: LSI Corporation, Milpitas, CA (US)

( * ) Notice: Subject to any disclaimer, the term of this patent is extended or adjusted under 35 U.S.C. 154(b) by 137 days.

(21) Appl. No.: 13/241,470

(22) Filed: Sep. 23, 2011

(65) Prior Publication Data

US 2013/0077615 A1 Mar. 28, 2013

(51) Int. Cl.
*H04L 12/28* (2006.01)
(52) U.S. Cl.
USPC ............ 370/394; 370/332; 370/203; 370/320
(58) Field of Classification Search
None
See application file for complete search history.

(56) References Cited

U.S. PATENT DOCUMENTS

| | | | | |
|---|---|---|---|---|
| 8,156,389 | B2 * | 4/2012 | Palanki et al. ................ | 714/701 |
| 8,156,390 | B2 * | 4/2012 | Palanki et al. ................ | 714/701 |
| 8,365,047 | B2 * | 1/2013 | Palanki et al. ................ | 714/776 |
| 2004/0146029 | A1 * | 7/2004 | Tong et al. .................... | 370/335 |
| 2004/0240409 | A1 * | 12/2004 | Mantha et al. ................ | 370/328 |
| 2008/0049706 | A1 * | 2/2008 | Khandekar et al. .......... | 370/342 |
| 2010/0015978 | A1 * | 1/2010 | Yoon et al. ................ | 455/435.3 |
| 2011/0280185 | A1 * | 11/2011 | Wu et al. ...................... | 370/328 |
| 2011/0305237 | A1 * | 12/2011 | Luo et al. ..................... | 370/350 |
| 2012/0045024 | A1 * | 2/2012 | Cui et al. ..................... | 375/341 |
| 2013/0010685 | A1 * | 1/2013 | Kim et al. .................... | 370/315 |
| 2013/0022085 | A1 * | 1/2013 | Krasner ........................ | 375/142 |
| 2013/0064099 | A1 * | 3/2013 | Kim et al. .................... | 370/241 |

OTHER PUBLICATIONS

Fast Pruned Interleaving ; Mansour, M. ISSN : 0090-6778; Digital Object Identifier : 10.1109/TCOMM.2012.120512.120252 Date of Publication : Dec. 20, 2012; Sponsored by : IEEE Communications Society.*
3GPP TS 25.222 V9.2.0 (Jun. 2010) Technical Specification, 3rd Generation Partnership Project; Technical Specification Group Radio Access Network; Multiplexing and channel coding (TDD), (Release 9).*
Du Xiangran; Wang Xizhao; and Wan Yuanyuan, "Hybrid Pruning Algorithm", Computer Science-Technology and Applications, 2009. IFCSTA '09 International Forum, on Dec. 25-27, 2009, Key Lab. of Machine Learning & Computer Intelligence, Hebei Univ., Baoding, China; vol. 1, pp. 30-33, Conference Publication.*
Johannes Furnkranz; "Pruning Algorithms for Rule Learning", Machine Learning Journal; vol. 27, Issue 2 , pp. 139-172, May 1, 1997.*
Mansour, M.; "Parallel Lookahead Algorithms for Pruned Interleavers", IEEE Transactions on Communications, vol. 57, Issue: 11 having Digital Object Identifier: 10.1109/TCOMM.2009.11.070661; Publication Year: 2009, pp. 3188-3194.*

* cited by examiner

*Primary Examiner* — Andrew Lai
*Assistant Examiner* — Hoyet H Andrews

(57) ABSTRACT

Described embodiments provide a wideband code division multiple access (W-CDMA) system, that employs an interleaving rule having a modified pruning algorithm. Interleaving, by pruning a sequence of bits in the W-CDMA system, includes determining a non-pruned interleaved vector having a length N. The determination of the non-pruned interleaved vector is based on a received length of an input vector from the sequence of bits. The input vector is padded. An interleaver generates a pre-pruned interleaved vector having a length equal to the length N, wherein the pre-pruned interleaved vector is a function of the padded input vector and the non-pruned interleaving vector. The interleaver prunes one or more elements from the pre-pruned interleaved vector based on a corresponding pruning indication in a pruning indication table, thereby providing a pruned interleaved vector as a portion of the interleaved sequence of bits.

20 Claims, 5 Drawing Sheets

INTERLEAVING FOR WIDEBAND CODE DIVISION MULTIPLE ACCESS

BACKGROUND OF THE INVENTION

1. Field of the Invention

The present invention relates to communication systems, in particular, wideband code division multiple access (W-CDMA) systems with turbo coding.

2. Description of the Related Art

Code Division Multiple Access (CDMA) is a channel access method used by radio communication technologies. CDMA enables signals to be multiplexed over the same channel by assigning each transmitter a code. The data bits are combined with a code so that the signal can only be intercepted by a receiver whose frequency response is programmed with the same code. The code changes at the chipping rate which is much faster than the original sequence of data bits. The result of combining the data signal with the code is a spread spectrum signal that resists interference and enables the original data to be recovered if the original data bits are damaged during transmission. CDMA technology optimizes the use of available bandwidth, and is used in communications such as ultra-high frequency cellular telephone systems.

Wideband CDMA (W-CDMA) is an International Telecommunications Standard (ITU) derived from CDMA technology. The code in W-CDMA technology is a wideband spread signal. W-CDMA is found in communications such as 3G mobile telecommunications networks. W-CDMA transmits on a pair of 5 MHz-wide carrier channels, whereas narrowband CDMA transmits on 200 kHz-wide channels. W-CDMA has been developed into a complete set of specifications. Specifically, details on W-CDMA multiplexing, channel coding and interleaving are described in "3rd Generation Partnership Project (3GPP); Technical Specification Group Radio Access Network; Multiplexing and channel coding (FDD) (3GPP TS 25.212)", hereinafter referred to as "3GPP TS 25.212". 3GPP TS 25.212 defines turbo coding schemes and an interleaving algorithm.

In general, turbo coding encodes a packet of traffic data to generate a packet of code bits. Turbo codes often systematically generate redundant data to messages, allowing a receiver (e.g., a base station or cellular handset) to detect and correct errors in a message without the need to ask the sender for additional data. Turbo codes might rely on an interleaver to receive input data, shuffle or re-order the input data, and provide the shuffled data as output data. Interleavers are employed in many wireless communication systems to reduce the impact of noise and interference on performance. For example, channel interleaving is commonly utilized to protect against a burst of errors due to noise and interference. At a transmitter, a channel interleaver shuffles code bits from a channel encoder so that consecutive code bits are spread apart in the interleaved bits. When a sequence of interleaved bits is involved in a burst of errors, these interleaved bits are spread apart after the complementary reshuffling by a channel de-interleaver at a receiver. Thus, interleaving breaks temporal correlation between successive bits involved in a burst of errors, which may improve overall system performance.

Section 4.2.3.2.3 of 3GPP TS 25.212 describes a Turbo code internal interleaver. The described interleaver consists of bits input into a rectangular matrix with padding. The interleaver consists of intra-row and inter-row permutations of the rectangular matrix. The output of the Turbo code interleaver is the bit sequence read out column by column from the intra-row and inter-row permutated rectangular matrix. The output is pruned by deleting dummy bits that were padded to the input of the rectangular matrix before intra-row and inter-row permutations. The interleaver might be implemented directly as described in the specification document, and the interleaver might be implemented using a pre-calculated interleaving table for each different length of input bits. Implementing the interleaver directly as described in the specification document consumes a lot of computing resources and might create real-time problems. Moreover, using interleaving lookup tables for each possible input length creates a large amount of pre-calculated data, resulting in large memory consumption.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a wideband code division multiple access (W-CDMA) system, operating in accordance with a 3GPP standard, that employs an interleaving rule having a modified pruning algorithm. Interleaving, by pruning a sequence of bits, includes determining, by a pruning algorithm, a non-pruned interleaved vector having a length N. The determination of the non-pruned interleaved vector is based on a received length of an input vector from the sequence of bits. The input vector is padded. An interleaver generates a pre-pruned interleaved vector having a length equal to the length N, wherein the pre-pruned interleaved vector is a function of the padded input vector and the non-pruned interleaving vector. The interleaver prunes one or more elements from the pre-pruned interleaved vector. Pruning comprises, when an index corresponding to the element equals one or more predetermined values, looking up a corresponding pruning indication in a pruning indication table and pruning the associated element based on the corresponding pruning indication, thereby providing a pruned interleaved vector as a portion of the interleaved sequence of bits.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

In accordance with embodiments of the present invention, a wideband code division multiple access (W-CDMA) system, operating in accordance with a 3GPP standard, employs an interleaving rule having a modified pruning algorithm. Interleaving, by pruning a sequence of bits, includes determining, by a pruning algorithm, a non-pruned interleaved vector having a length N. The determination of the non-pruned interleaved vector is based on a received length of an input vector from the sequence of bits. The input vector is padded. An interleaver generates a pre-pruned interleaved vector having a length equal to the length N, wherein the pre-pruned interleaved vector is a function of the padded input vector and the non-pruned interleaving vector. The interleaver prunes one or more elements from the pre-pruned interleaved vector. Pruning comprises, when an index corresponding to the element equals one or more predetermined values, looking up a corresponding pruning indication in a pruning indication table and pruning the associated element based on the corresponding pruning indication, thereby providing a pruned interleaved vector as a portion of the interleaved sequence of bits. Embodiments of the present invention thus provide for the advantages of reduced memory consumption and reduced complexity when applying pruning in W-CDMA systems.

Figure 1:
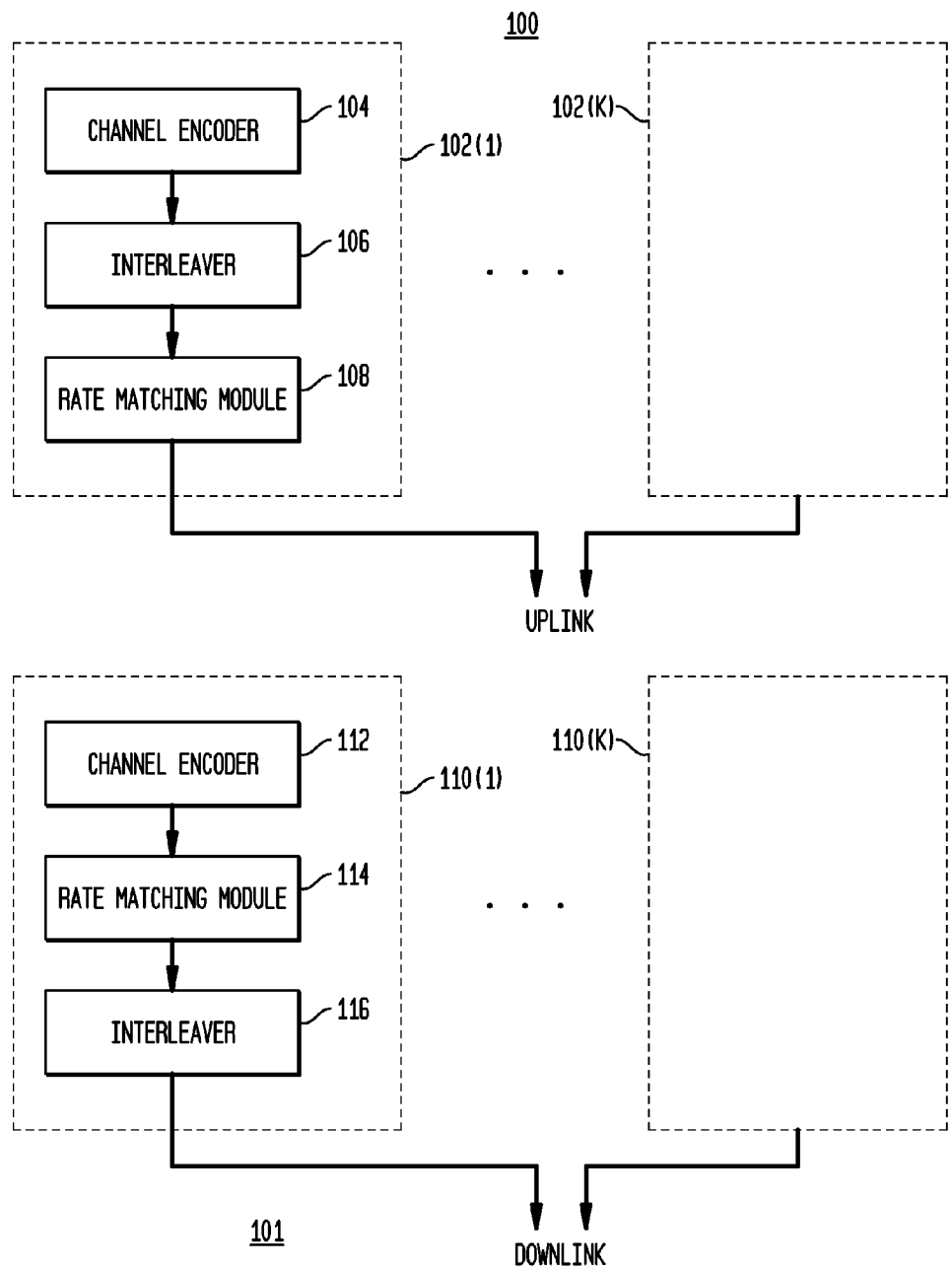
FIG. 1 shows an exemplary system employing interleaving in accordance with a 3GPP standard operating in accordance with exemplary embodiments of the present invention.

FIG. 1 shows W-CDMA system uplink and downlink portions 100 and 101, respectively, employing an interleaving rule having a modified pruning algorithm operating in accordance with exemplary embodiments of the present invention. In uplink transceiver 100, data streams of several transport channel blocks 102(1)-102(K) having, for example, the same quality of service (hereafter "QoS") are processed. For example, transport channel block 102(1) provides for a channel coding by channel encoder 104 according to a desired code rate, and then are branched off into several sequences. These sequences are then interleaved by interleaver 106 using a modified pruning algorithm in accordance with embodiments of the present invention, as described subsequently. After interleaving, sequences undergo rate matching by rate matching module 108.

In the downlink transceiver 101, transport channel data streams of several transport channel blocks 110(1)-110(K) having the same QoS are processed. For example, in transport channel block 110(1), the data stream is subject to a channel coding by channel encoder 112 according to a desired code rate, and then are branched off into several sequences. The sequences of the respective branches then undergo rate matching by rate matching module 114. From rate matching module 114, the sequences are then interleaved by interleaver 116 in code-symbol by code-symbol units.

As an aid to understanding the present invention, Section 4.2.3.2 of 3GPP TS 25.212 specifies a turbo coding scheme for interleaving for W-CDMA communication systems operating in accordance with the standard. Bits input to the internal interleaver are denoted by $x_1, x_2, x_3, \ldots x_K$, where K is the number of bits input to the turbo code internal interleaver. The interleaver consists of bits-input to a rectangular matrix with padding, intra-row and inter-row permutations of the rectangular matrix, and bits-output from the rectangular matrix with pruning Parameters used in the turbo code internal interleaver are given in Section 4.2.3.2.3 of 3GPP TS 25.212. For example, R represents the number of rows in the rectangular matrix and C represents the number of columns in the rectangular matrix. The input bit sequence $x_1, x_2, x_3, \ldots x_K$ is written into the R×C rectangular matrix row by row starting with column 0 of row 0. The sequence $y_1, y_2, y_3, \ldots y_{R \times C}$ represents the bits written into the rectangular matrix. If R×C is greater than K, the dummy bits are padded such that $y_k=0$ or 1, for k=K+1, K+2, . . . , R×C. After the intra-row and inter-row permutations described in Section 4.2.3.2.3.2 of 3GPP TS 25.212, the dummy bits are pruned away from the output of the permuted rectangular matrix.

Figure 2:
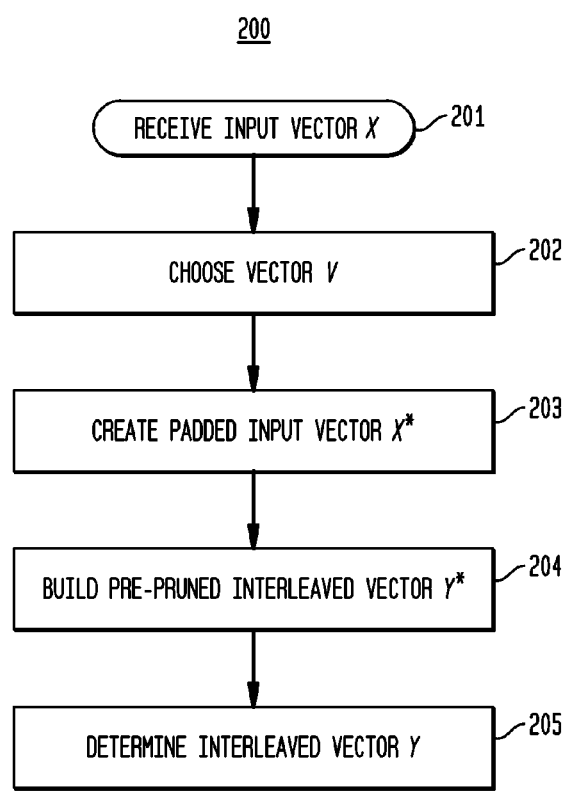
FIG. 2 shows an exemplary method for interleaving bits with pruning in accordance with a 3GPP standard as employed by the system of FIG. 1.
Figure 3:
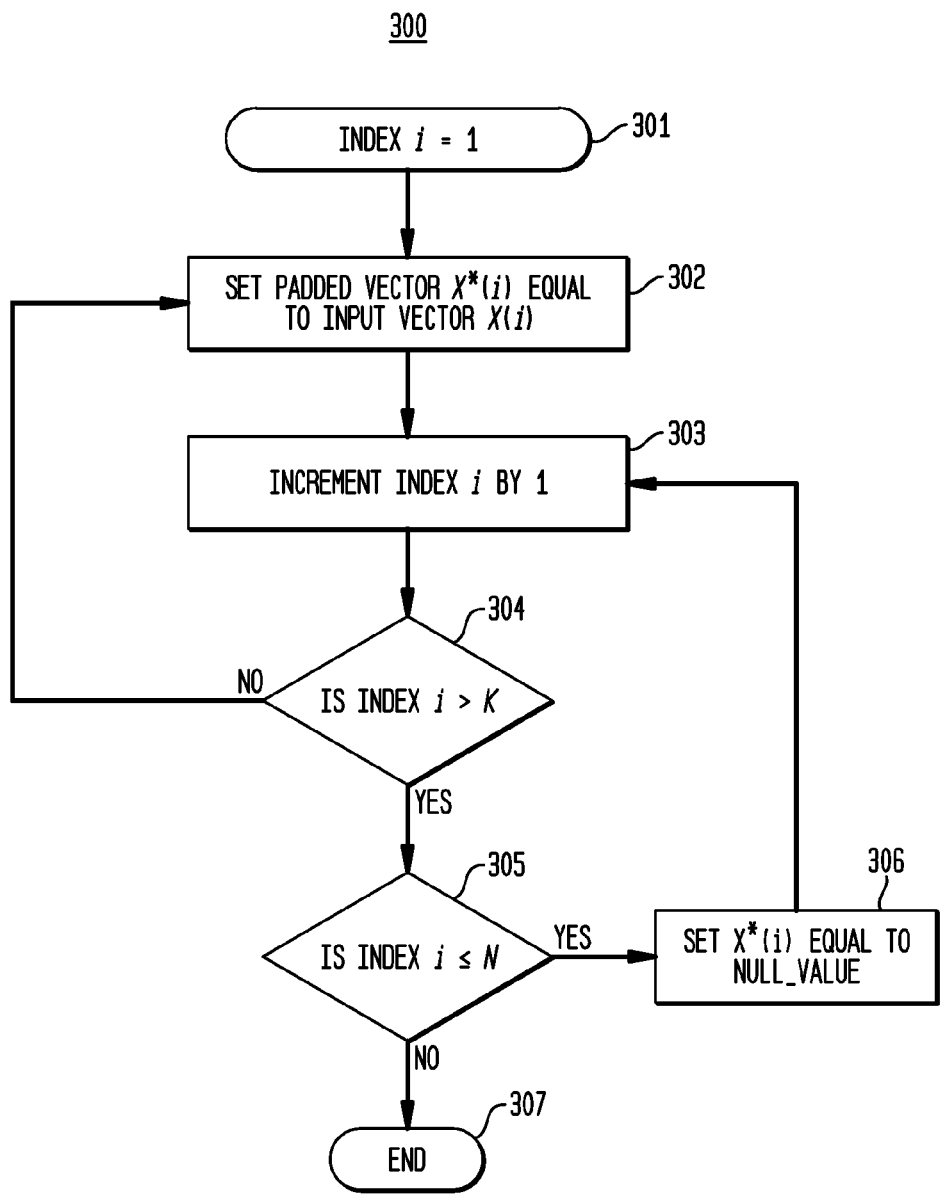
FIG. 3 shows an exemplary method for padding an input vector in accordance with exemplary embodiments of the present invention.

Embodiments of the present invention might modify the interleaving process specified in the 3GPP TS 25.212 to a modified pruning algorithm allowing for pre-calculated interleaving tables and pruning indication tables (providing a substantially similar result as the interleaving process defined in Section 4.2.3.2 of 3GPP TS 25.212). Referring to FIG. 2, at step 201, input vector X is received by an interleaver such as interleaver 106. Input vector X might contain K values (or elements). At step 202, a non-pruned interleaving vector V is chosen, based on the input length K of input vector X Pre-calculated vector V has a length N that is greater than or equal to K. Vector V might contain a permutation of the elements 1, 2, . . . , N. At step 203, a padded input vector X* is created such that X*(1, 2, . . . , K)=X(1, 2, . . . , K) and X*(K+1, . . . , N)=NULL_VALUE, where NULL_VALUE is a value indicating a null or non-interpreted bit value. Stated another way, any value that is not interpreted as a value of X is equal to NULL_VALUE in X*. For example, if X=[1, 2, 4] and N=5, then X*=[1, 2, 4, NULL_VALUE, NULL_VALUE]. FIG. 3 shows exemplary padding method 300 in accordance with embodiments of the present invention. Exemplary padding method 300 begins with index i equal to 1 at step 301. At step 302, padded vector X*(i) is set to equal input vector X(i). Index i is incremented by 1 at step 303. A test at step 304 determines if index i is greater than input vector X length K. If index i is not greater than input length K, the process returns to step 302 where padded input vector X*(i) is set to equal input vector X(i). If index i is greater than input length K, a test at step 305 determines if index i is less than or equal to vector V length N. If index i is less than or equal to length N, the process proceeds to step 306 where padded input vector X*(i) is set to equal NULL_VALUE. After step 306, the process returns to step 303 where index i is incremented by 1. If the test at step 305 determines that index i is greater than length N, padded input vector X* is created and the process ends at step 307.

Figure 4:
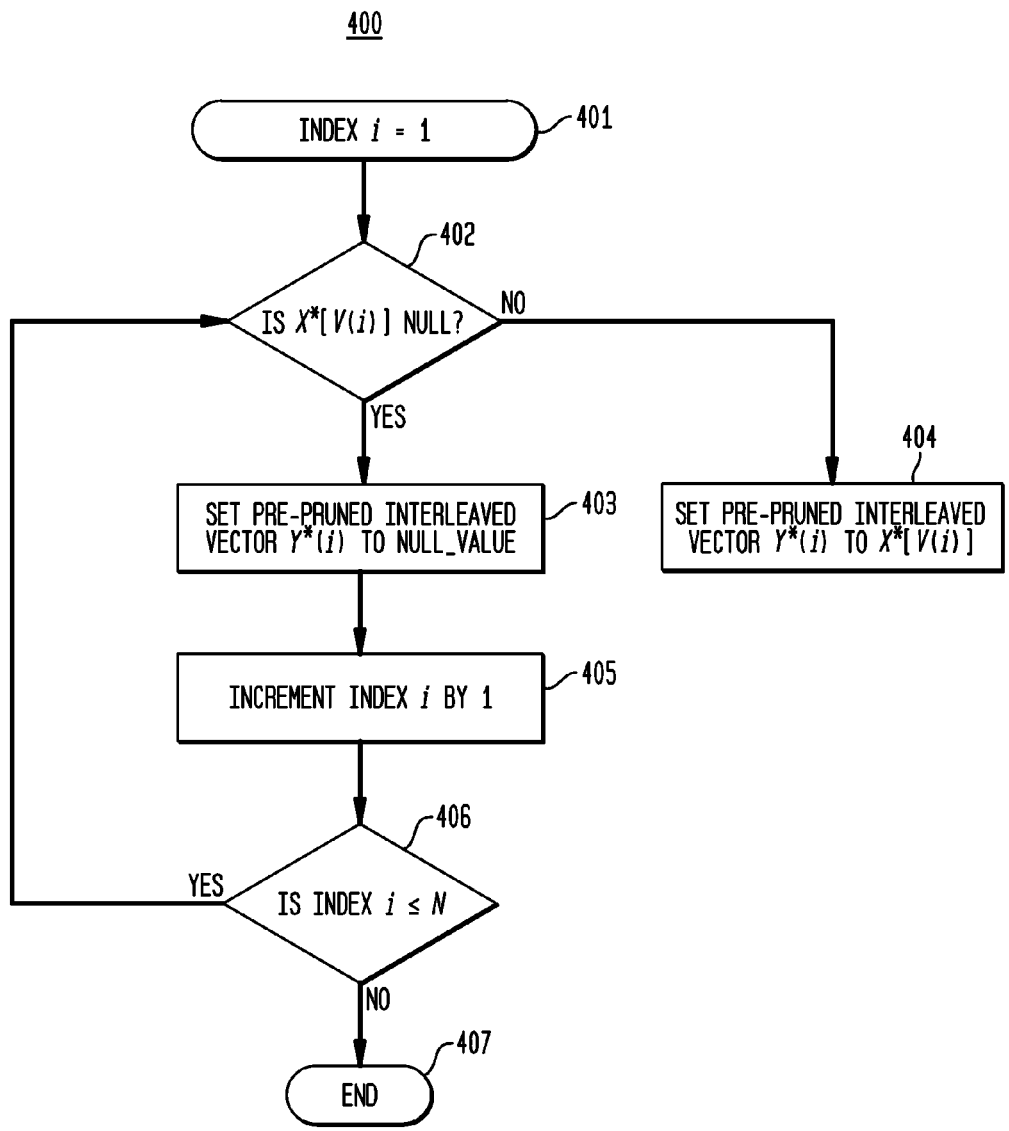
FIG. 4 shows an exemplary method for building a pre-pruned interleaved vector in accordance with exemplary embodiments of the present invention.

Following the creation of padded input vector X* step 203, a pre-pruned interleaved vector Y* is built at step 204 such that Y*(i)=X*[V(i)], where i=1, 2, . . . , N. For example, if X=X*=[1, 2, 4, NULL_VALUE, NULL_VALUE] and V(i)=[1, 5, 4, 3, 2], then Y*=[X*(1), X*(5), X*(4), X*(3), X*(2)], which is equivalent to [1, NULL_VALUE, NULL_VALUE, 4, 2]. FIG. 4 shows exemplary building method 400 in accordance with embodiments of the present invention. Exemplary building method 400 begins with index i equal to 1 at step 401. At step 402, a test determines whether the value of the padded input vector X* at vector V(i) is null. If X*[V(i)] is not null, the process proceeds to step 404 where pre-pruned interleaved vector Y*(i) is set to equal X*[V(i)]. If X*[V(i)] is null, the process proceeds to step 403 where pre-pruned interleaved vector Y*(i) is set to NULL_VALUE. After both steps 403 and 404, index i is incremented by 1 at step 405. If the test at step 406 determines that index i is less than or equal to vector V length N, the process returns to the test at step 402 to determine if X*[V(i)] is null. If index i is greater than length N, the pre-pruned interleaved vector Y* is complete and the process ends at step 407.

Figure 5:
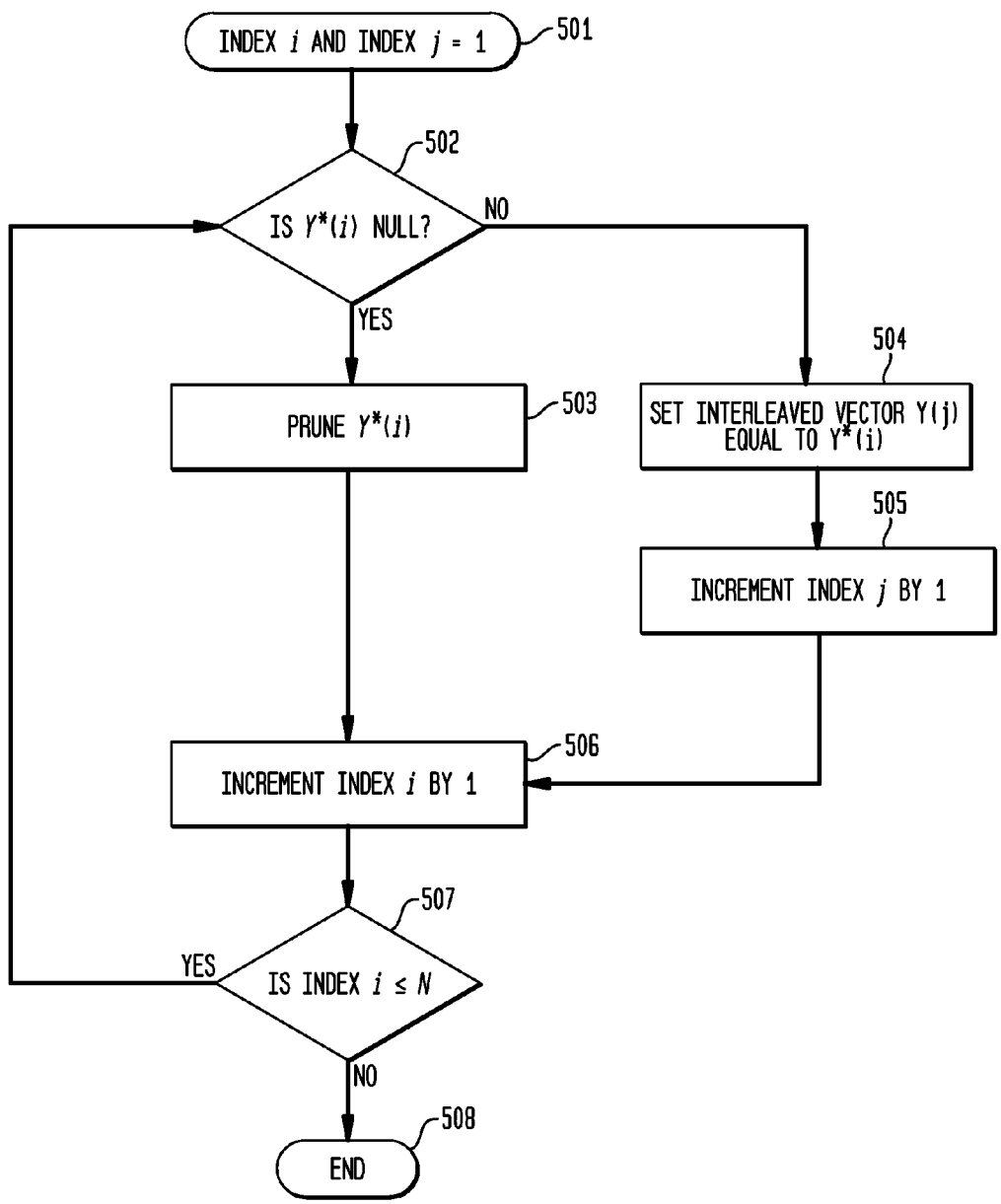
FIG. 5 shows an exemplary method for determining an interleaved vector in accordance with exemplary embodiments of the present invention.

After pre-pruned interleaved vector Y* at step 204 is built the process proceeds to step 205. At step 205, interleaved vector Y is determined by pruning Y*. Y might be determined such that Y(1) is equal to the element with the smallest index in Y* that has a value that is not equal to NULL_VALUE; and Y(j+1) is equal to the element with smallest index in Y* with a value that is not equal to NULL_VALUE and was not used for Y(1 to j). For example, if Y*=[X*(1), X*(5), X*(4), X*(3), X*(2)]=[1, NULL_VALUE, NULL_VALUE, 4, 2], then Y=[1, 4, 2]. FIG. 5 shows exemplary determining interleaved vector method 500 in accordance with embodiments of the present invention. At step 501, index i and index j equal 1. A test at step 502 determines if pre-pruned interleaved vector Y*(i) is null. If Y*(i) is null, Y*(i) is pruned from interleaved vector Y at step 503. If Y*(i) is not null, interleaved vector Y(j) is set to equal pre-pruned interleaved vector Y*(i) at step 504. After step 504, index j is incremented by 1 at step 505. After both steps 505 and 503, index i is incremented by 1 at step 506. The process proceeds to step 507 where a test determines if index i is less than or equal to vector V length N. If index is less than or equal to length N, the process returns to step 502 for another iteration of the method. If index i is greater than length N, interleaved vector Y is complete and the process ends at step 508.

In embodiments of the present invention, NULL_VALUE elements in Y* might only be located in elements with an index of the form R×n+C, where (n, R, C) are integers. R represents the number of rows in the rectangular matrix and C represents the number of columns in the rectangular matrix. Therefore, embodiments of the present invention utilize a pruning indication table for each possible input length of input vector X. The pruning indication table holds a pruning indication, such as a logic '1' indicating the element should be pruned. On these tables, the nth entry of each table might hold an indication of whether each element (R×n+C) in Y* should be pruned. During interleaving, vector Y might be directly created by the order of elements inside it. For example, each time a program reaches a potentially pruned element (e.g., an index=R×n+C), the next pruning indication is read by the program from the pruning indication table, and determines whether the element should pass to vector Y. This provides an advantage over previous implementations because values are checked only when pruning is possible. Additionally, since pruning indications are stored in a different table, the format of the indication might be chosen to enable easy implementation of the pruning. For example, pruning might be performed using logic instruction instead of using conditional statements and comparing values. Choosing the pruning indication representation might also improve memory consumption as compared to a direct table implementation.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

While the exemplary embodiments of the present invention have been described with respect to processing blocks in a software program, including possible implementation as a digital signal processor, micro-controller, or general purpose computer, the present invention is not so limited. As would be apparent to one skilled in the art, various functions of software may also be implemented as processes of circuits. Such circuits may be employed in, for example, a single integrated circuit, a multi-chip module, a single card, or a multi-card circuit pack.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here. It will be further understood that various changes in the details, materials, and arrangements of the parts which have been described and illustrated in order to explain the nature of this invention may be made by those skilled in the art without departing from the scope of the invention as expressed in the following claims.

We claim:

1. A method of interleaving a sequence of bits by a transmitting device in a wideband code division multiple access (W-CDMA) system, comprising:

determining, by an interleaver of the transmitting device, based on a received length of an input vector from the sequence of bits, a nonpruned interleaving vector having a length N, wherein the length N is at least equal to the received length of the input vector;

padding, by the interleaver, the input vector;

generating, by the interlayer, a pre-pruned interleaved vector having a length equal to the length N, wherein the prepruned interleaved vector is a function of the padded input vector and the non-pruned interleaving vector; and pruning, by the interleaver, one or more elements from the pre-pruned interleaved vector, wherein the pruning further comprises:
when an index corresponding to the element equals one or more predetermined values, looking up, by the interleaver, a corresponding pruning indication in a pruning indication table and pruning the associated element based on the corresponding pruning indication, thereby reducing processing of the pre-pruned interleaved vector such that processing is only performed when pruning is possible as indicated when the index corresponding to the element equals one or more predetermined values,
providing, by the interleaver, a pruned interleaved vector as a portion of the interleaved sequence of bits to a rate matching module of the W-CDMA system; and
transmitting, by the rate matching module, a rate-matched version of the interleaved sequence of bits over one or more transport channels to a receiving device.

2. The method as recited in claim 1, wherein the one or more predetermined values are equivalent to R×n+C, wherein:
R represents a number of rows in a rectangular matrix;
C represents a number of columns in the rectangular matrix; and
n represents an integer.

3. The method as recited in claim 1, wherein the padding the input vector further comprises:
if an index corresponding to an element in the padded input vector is greater than the received length of the input vector and is less than the length N, setting the corresponding element in the padded input vector equal to a null value.

4. The method as recited in claim 1, wherein padding the input vector further comprises:
if an index corresponding to an element in the padded input vector is greater than the received length of the input vector and is equal to the length N, setting the corresponding element in the padded input vector equal to a null value.

5. The method as recited in claim 1, wherein generating the pre-pruned interleaved vector further comprises:
determining a first element corresponding to a first index in the padded input vector, wherein the first index equals a value corresponding to a second index in the non-pruned interleaving vector.

6. The method as recited in claim 5, further comprising:
if the first element corresponding to the first index in the padded input vector is a null value, setting a second element corresponding to the second index in the pre-pruned interleaved vector equal to the null value.

7. The method as recited in claim 5, further comprising:
if the first element corresponding to the first index in the padded input vector is not a null value, setting a second element corresponding to the second index in the pre-pruned interleaved vector equal to the first element corresponding to the first index in the padded input vector.

8. The method as recited in claim 1, wherein the method is implemented as steps executed by an integrated circuit.

9. The method as recited in claim 1, wherein the transmitting device is a wireless handset device.

10. The method as recited in claim 1, wherein the transmitting device is at least one of a wireless handset device and a base station of the W-CDMA system operating in accordance with a 3GPP standard.

11. A transceiver device operable in a wideband code division multiple access (W-CDMA) system, comprising:
a non-pruned interleaving vector having a length N, wherein the length N is at least equal to a received length of an input vector from a sequence of bits;
an interleaver configured to pad the input vector and generate a pre-pruned interleaved vector having a length equal to the length N, wherein the pre-pruned interleaved vector is a function of the padded input vector and the non-pruned interleaving vector;
a pruning indication table comprising one or more pruning indications,
wherein, the interleaver is further configured to, when an index corresponding to an element in the pre-pruned interleaved vector equals one or more predetermined values, prune the associated element from the pre-pruned interleaved vector based on the corresponding pruning indication in the pruning indication table, thereby providing a pruned interleaved vector as a portion of the interleaved sequence of bits, thereby reducing processing by the interleaver of the pre-pruned interleaved vector such that processing is only performed when pruning is possible as indicated when the index corresponding to the element equals one or more predetermined values; and
a rate matching module configured to (i) receive the pruned interleaved vector as a portion of the interleaved sequence of bits from the interleaver and (ii) transmit a rate-matched version of the interleaved sequence of bits over one or more transport channels to a receiving device.

12. The transceiver device of claim 11, wherein the one or more predetermined values are equivalent to R×n+C, wherein:
R represents a number of rows in a rectangular matrix;
C represents a number of columns in the rectangular matrix; and
n represents an integer.

13. The transceiver device of claim 11, wherein the interleaver is further adapted to:
if an index corresponding to an element in the padded input vector is greater than the received length of the input vector and is less than the length N, set the corresponding element in the padded input vector equal to a null value.

14. The transceiver device of 11, wherein the interleaver is further adapted to:
if an index corresponding to an element in the padded input vector is greater than the received length of the input vector and is equal to the length N, set the corresponding element in the padded input vector equal to a null value.

15. The transceiver device of claim 11, wherein the interleaver is further adapted to:
determine a first element corresponding to a first index in the padded input vector, wherein the first index equals a value corresponding to a second index in the non-pruned interleaving vector;
if the first element corresponding to the first index in the padded input vector is a null value, then:
the interleaver sets a second element corresponding to the second index in the pre-pruned interleaved vector equal to the null value,
else:
the interleaver sets a second element corresponding to the second index in the pre-pruned interleaved vector equal to the first element corresponding to the first index in the padded input vector.

16. The transceiver device of claim 11, wherein the transceiver device of the W-CDMA system operates in accordance with a 3GPP standard.

17. A non-transitory machine-readable storage medium, having encoded thereon program code, wherein, when the program code is executed by a machine, the machine implements a method for interleaving a sequence of bits by a transmitting device in a wideband code division multiple access (W-CDMA) system, comprising:
   determining, by an interleaver of the transmitting device, based on a received length of an input vector from the sequence of bits, a nonpruned interleaving vector having a length N, wherein the length N is at least equal to the received length of the input vector;
   padding, by the interleaver, the input vector;
   generating, by the interleaver, a pre-pruned interleaved vector having a length equal to the length N, wherein the prepruned interleaved vector is a function of the padded input vector and the non-pruned interleaving vector; and
   pruning, by the interleaver, one or more elements from the pre-pruned interleaved vector, wherein the pruning further comprises:
      when an index corresponding to the element equals one or more predetermined values, looking up, by the interleaver, a corresponding pruning indication in a pruning indication table and pruning the associated element based on the corresponding pruning indication, thereby reducing processing of the pre-pruned interleaved vector such that processing is only performed when pruning is possible as indicated when the index corresponding to the element equals one or more predetermined values,
   providing, by the interleaver, a pruned interleaved vector as a portion of the interleaved sequence of bits to a rate matching module of the W-CDMA system; and
   transmitting, by the rate matching module, a rate-matched version of the interleaved sequence of bits over one or more transport channels to a receiving device.

18. The storage medium as recited in claim 17, wherein the one or more predetermined values are equivalent to $R \times n + C$, wherein:
   R represents a number of rows in a rectangular matrix;
   C represents a number of columns in the rectangular matrix; and
   n represents an integer.

19. The storage medium as recited in claim 17, wherein the step of padding the input vector further comprises:
   if an index corresponding to an element in the padded input vector is greater than the received length of the input vector and is less than the length N, setting the corresponding element in the padded input vector equal to a null value.

20. The storage medium as recited in claim 17, wherein the step of generating the pre-pruned interleaved vector further comprises:
   determining a first element corresponding to a first index in the padded input vector, wherein the first index equals a value corresponding to a second index in the non-pruned interleaving vector; and
   if the first element corresponding to the first index in the padded input vector is a null value, setting a second element corresponding to the second index in the pre-pruned interleaved vector equal to the null value.

* * * * *